United States Patent
Lee

(10) Patent No.: US 7,982,393 B2
(45) Date of Patent: Jul. 19, 2011

(54) ORGANIC LIGHT EMITTING DEVICE USING INORGANIC INSULATING LAYER AS AN ELECTRON INJECTING LAYER AND METHOD FOR PREPARING THE SAME

(75) Inventor: Jung-Hyoung Lee, Daejeon Metropolitan City (KR)

(73) Assignee: LG Chem, Ltd., Seoul (KR)

( * ) Notice: Subject to any disclaimer, the term of this patent is extended or adjusted under 35 U.S.C. 154(b) by 97 days.

(21) Appl. No.: 12/223,388

(22) PCT Filed: Feb. 5, 2007

(86) PCT No.: PCT/KR2007/000595
§ 371 (c)(1),
(2), (4) Date: Jul. 30, 2008

(87) PCT Pub. No.: WO2007/091805
PCT Pub. Date: Aug. 16, 2007

(65) Prior Publication Data
US 2009/0021159 A1 Jan. 22, 2009

(30) Foreign Application Priority Data
Feb. 6, 2006 (KR) .................. 10-2006-0011330

(51) Int. Cl.
*H01J 1/62* (2006.01)
*H01J 63/04* (2006.01)
(52) U.S. Cl. ......... 313/504; 313/498; 313/503; 313/506
(58) Field of Classification Search .......... 313/498–512; 428/690, 917; 445/24–25
See application file for complete search history.

(56) References Cited

U.S. PATENT DOCUMENTS

| 5,989,738 | A | 11/1999 | Haase et al. | |
|---|---|---|---|---|
| 6,198,219 | B1 | 3/2001 | Arai et al. | |
| 6,303,239 | B1 | 10/2001 | Arai et al. | |
| 6,322,910 | B1 | 11/2001 | Arai et al. | |
| 6,926,572 | B2 | 8/2005 | Park et al. | |
| 2002/0011782 | A1* | 1/2002 | Lee et al. | 313/504 |
| 2002/0053871 | A1* | 5/2002 | Seo | 313/504 |
| 2002/0119384 | A1* | 8/2002 | Koyama et al. | 430/79 |
| 2003/0094897 | A1* | 5/2003 | Koyama et al. | 313/512 |
| 2003/0151359 | A1 | 8/2003 | Okada et al. | |
| 2004/0113547 | A1* | 6/2004 | Son et al. | 313/504 |
| 2004/0227143 | A1 | 11/2004 | Redecker et al. | |
| 2005/0077820 | A1* | 4/2005 | Onishi et al. | 313/506 |
| 2005/0100760 | A1* | 5/2005 | Yokoyama | 428/690 |
| 2006/0049745 | A1* | 3/2006 | Handa et al. | 313/503 |
| 2006/0049747 | A1* | 3/2006 | Matsuda et al. | 313/504 |
| 2006/0113901 | A1* | 6/2006 | Oh et al. | 313/504 |
| 2007/0170446 | A1* | 7/2007 | Cho et al. | 257/98 |

FOREIGN PATENT DOCUMENTS

| CN | 1551698 A | 12/2004 |
|---|---|---|
| JP | 10-097895 | 4/1998 |
| JP | 11-307261 | 11/1999 |

* cited by examiner

*Primary Examiner* — Joseph L Williams
*Assistant Examiner* — Kevin Quarterman
(74) *Attorney, Agent, or Firm* — McKenna Long & Aldridge LLP

(57) ABSTRACT

The present invention provides an organic light emitting device, wherein an electron injecting electrode, at least one organic material layer including a light emitting layer, and a hole injecting electrode are laminated; and an inorganic insulating layer formed from the materials having a band gap of 3.3 eV or more, and a band offset of 0.45 eV or less, is provided between the electron injecting electrode and the organic material layer; and a method for preparing the same.

11 Claims, 4 Drawing Sheets

[Fig. 1]
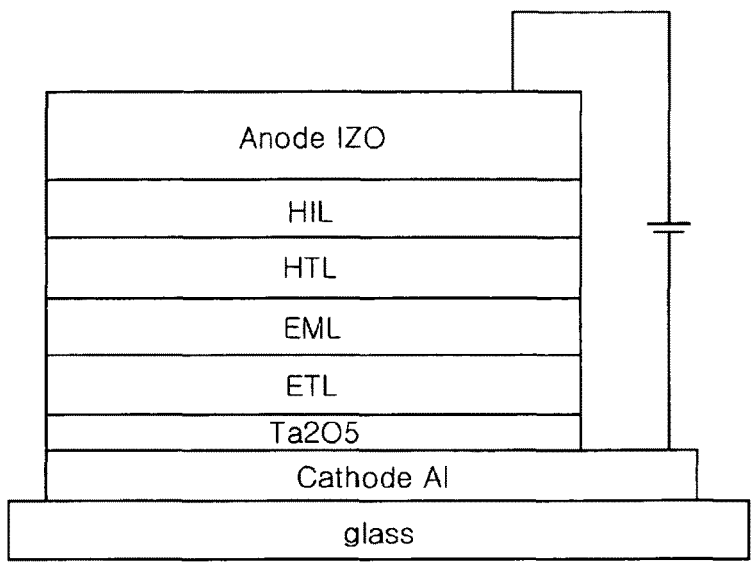
[Fig. 2]
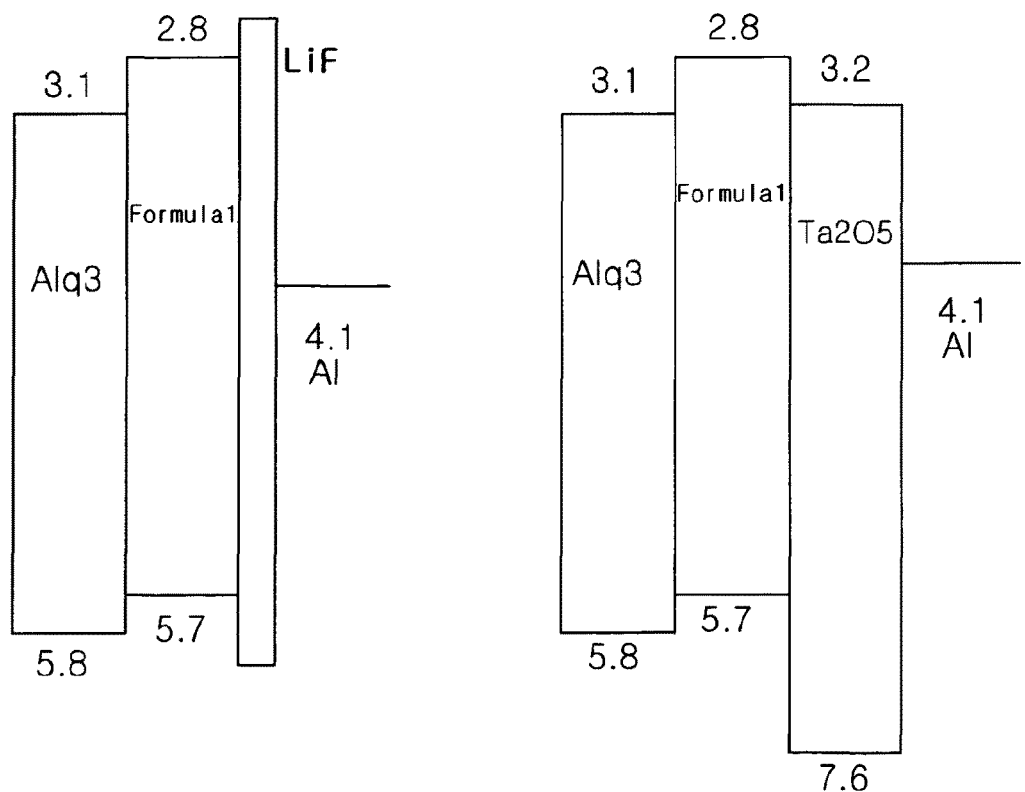

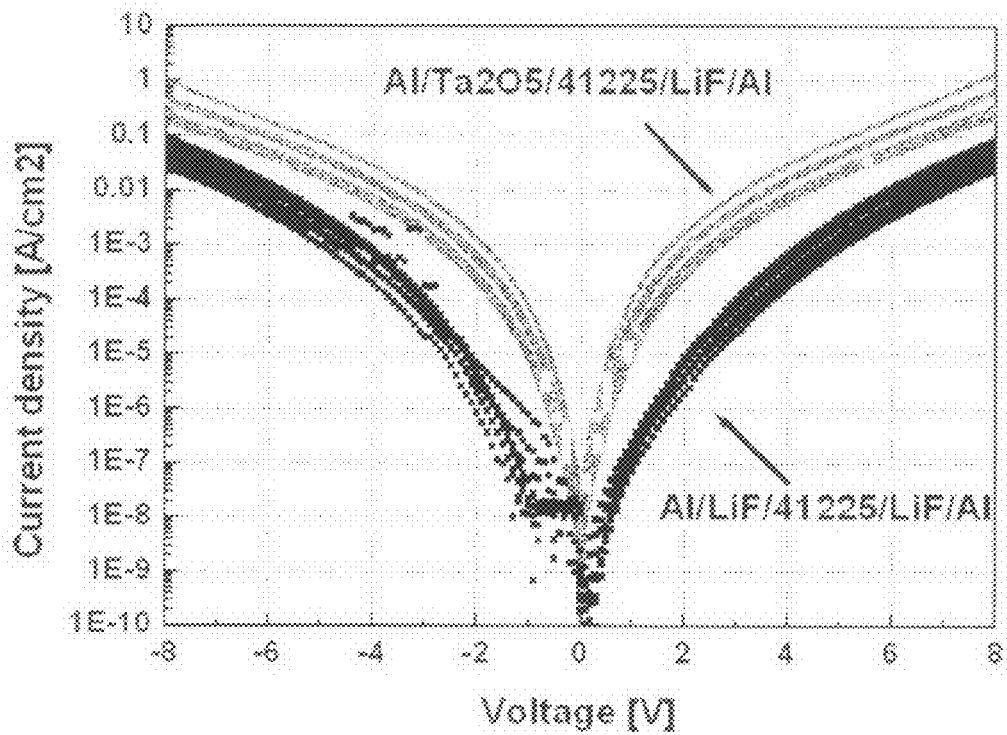
[Fig. 3]
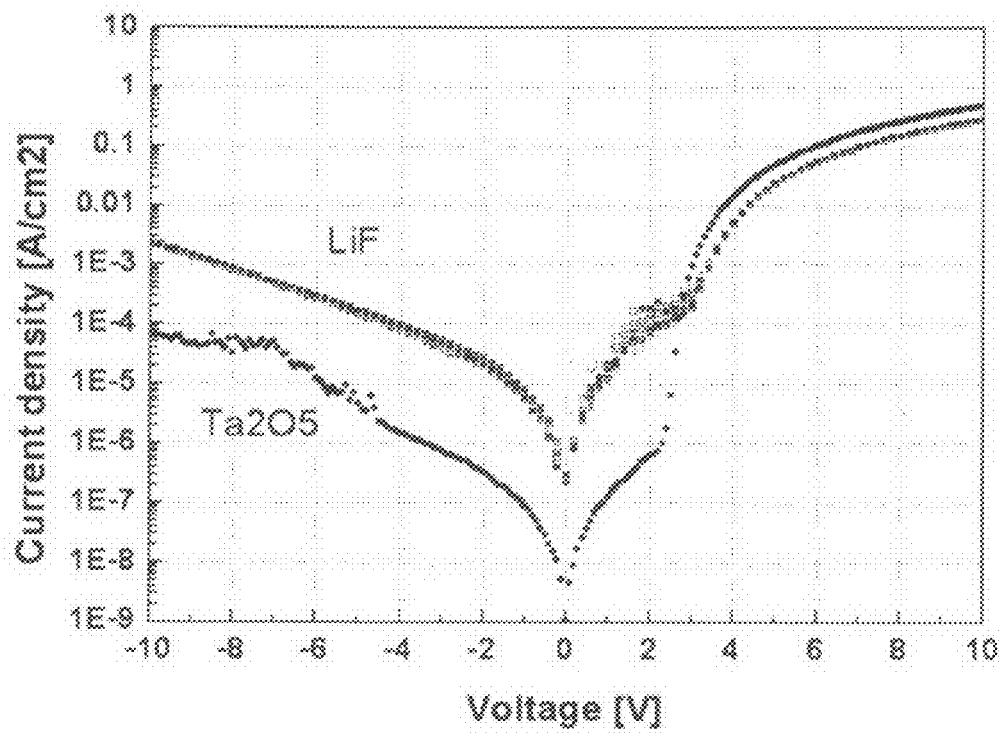
[Fig. 4]

[Fig. 5]
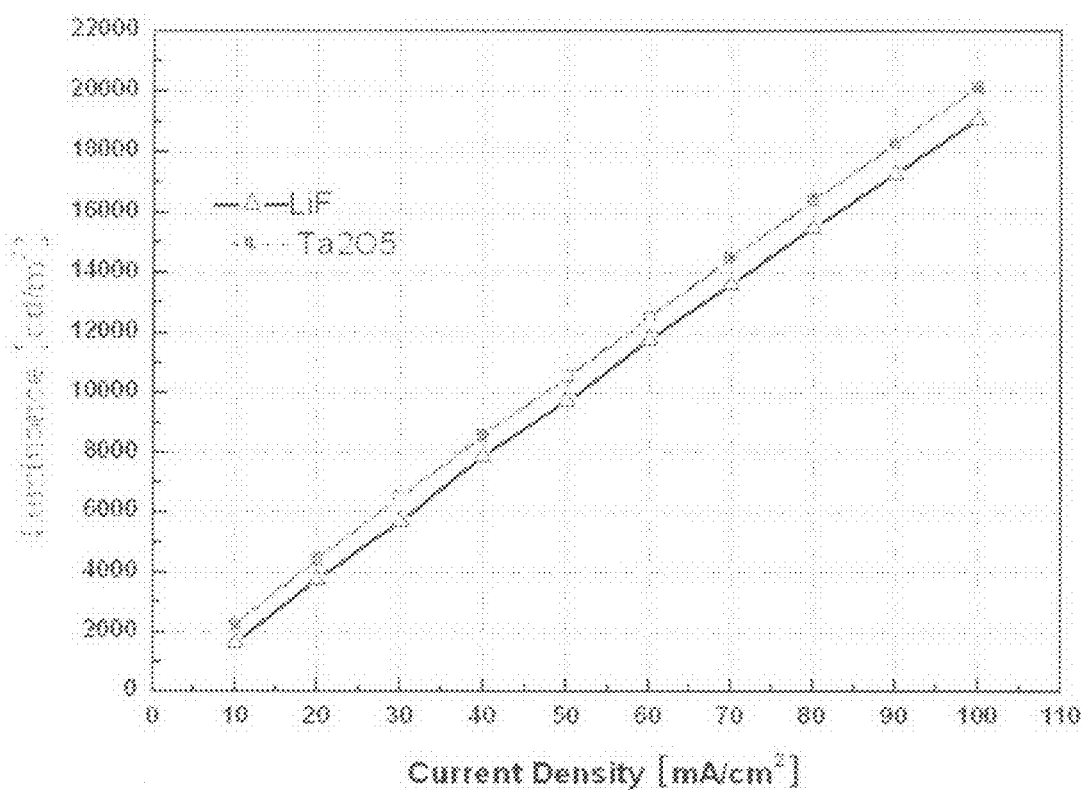
[Fig. 6]
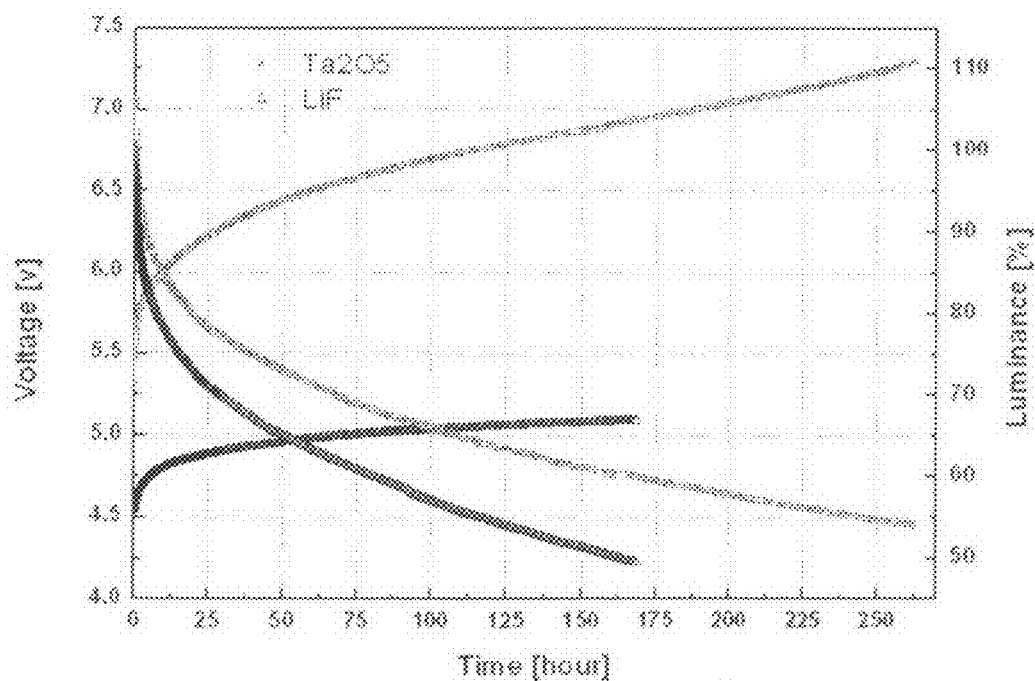

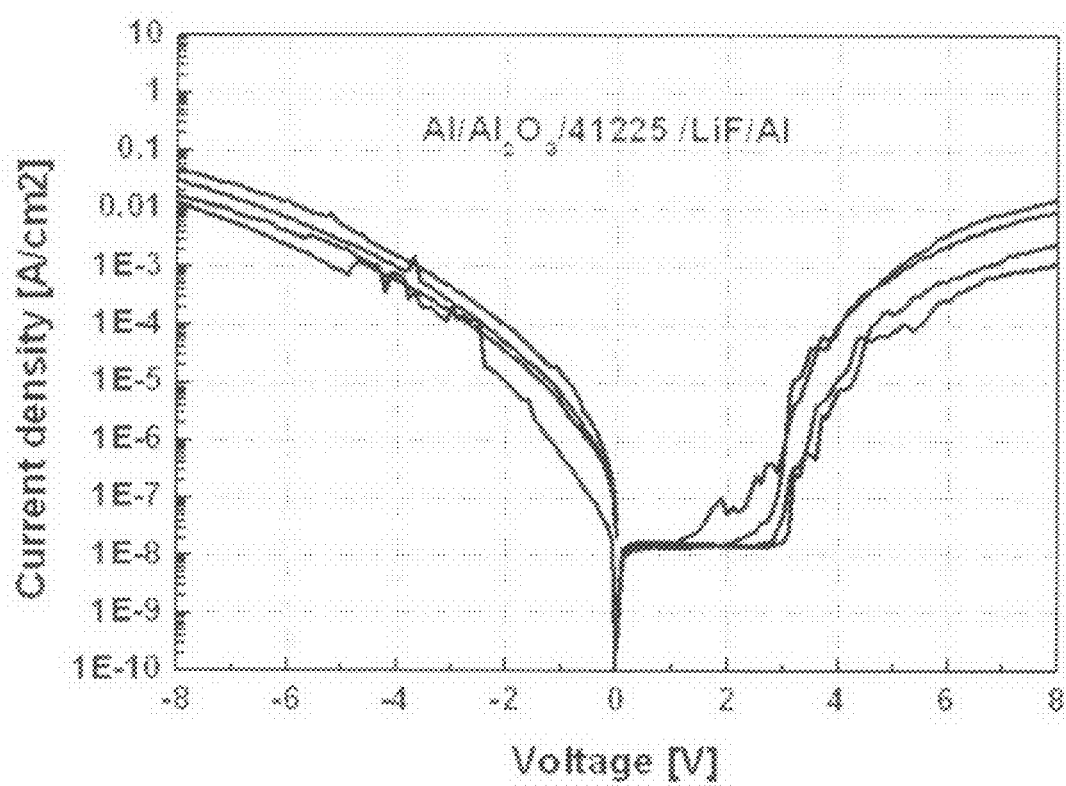

ORGANIC LIGHT EMITTING DEVICE USING INORGANIC INSULATING LAYER AS AN ELECTRON INJECTING LAYER AND METHOD FOR PREPARING THE SAME

This application claims the benefit of International Application Number PCT/KR/2007/000595 filed on Feb. 5, 2007 and Korean Application No. 10-2006-0011330 filed on Feb. 6, 2006, both of which are hereby incorporated by reference as if fully set forth herein.

TECHNICAL FIELD

The present invention relates to an organic light emitting device, and to a method for preparing the same. Specifically, the present invention relates to an organic light emitting device comprising an inorganic insulating layer having excellent electron injecting and hole blocking abilities as an electron injecting layer, and to a method for preparing the same.

This application claims the benefit of the filing data of Korean Patent Application No. 10-2006-0011330, filed on Feb. 6, 2006 in the Korean Intellectual Property Office, the disclosure of which is incorporated herein in its entirety by reference.

BACKGROUND ART

In general, the term "organic light emitting phenomenon" refers to a phenomenon in which electric energy is converted to light energy by means of an organic material. The organic light emitting device using the organic light emitting phenomenon has a structure usually comprising an anode, a cathode and an organic material layer interposed therebetween. Herein, the organic material layer may be mostly formed in a multilayer structure comprising layers of different materials, for example, the hole injecting layer (HIL), the hole transporting layer (HTL), the light emitting layer (EML), the electron transporting layer (ETL), the electron injecting layer and the like, in order to improve efficiency and stability of the organic light emitting device. In the organic light emitting device having such a structure, when a voltage is applied between two electrodes, holes from the anode and electrons from a cathode are injected into the organic material layer, the holes and the electrons injected are combined together to form excitons. Further, when the excitons drop to a ground state, lights are emitted. Such the organic light emitting device is known to have characteristics such as self-luminescence, high luminance, high efficiency, low drive voltage, wide viewing angle, high contrast and high-speed response.

However, the conventional organic light emitting devices have problems that they have large difference in the work functions between the electron transporting layer and the cathode material, which does not allow easy electron injecting, and a relatively large amount of holes are injected toward the cathode, which lowers the light emitting efficiency. LiF has been widely used as the materials of the electron injecting layer provided between the electron transporting layer and the cathode, but the material has no hole blocking ability.

DISCLOSURE OF INVENTION

Technical Problem

The present inventors have found that an organic light emitting device, wherein an electron injecting electrode, at least one organic material layer including a light emitting layer, and a hole injecting electrode are laminated; and an inorganic insulating layer formed from the materials having a band gap of 3.3 eV or more, and a band offset of 0.45 eV or less, is provided between the electron injecting electrode and the organic material layer, can have improved hole blocking effect in the direction of the electron injecting electrode, as well as the electron injecting effect.

Therefore, it is an object of the present invention to provide an organic light emitting device provided with an electron injecting layer having excellent electron injecting and hole blocking effects, and a method for preparing the same.

Technical Solution

The present invention provides an organic light emitting device, wherein an electron injecting electrode, at least one organic material layer including a light emitting layer, and a hole injecting electrode are laminated; and an inorganic insulating layer formed from the materials having a band gap of 3.3 eV or more, and a band offset of 0.45 eV or less, is provided between the electron injecting electrode and the organic material layer, in order to solve the above-described objects.

The present invention further provides a method for preparing an organic light emitting device, comprising a step of forming an electron injecting electrode, at least one organic material layer including a light emitting layer, and a hole injecting electrode, wherein a step of forming an inorganic insulating layer using the materials having a band gap of 3.3 eV or more, and a band offset of 0.45 eV or less, between the electron injecting electrode and the organic material layer, is performed between the step of forming the electron injecting electrode and the step of forming the organic material layer.

Advantageous Effects

The device according to the present invention, provided with an inorganic insulating layer formed from the materials having a band gap of 3.3 eV or more, and a band offset of 0.45 eV or less, as an electron injecting layer provided between the electron injecting electrode and the organic material layer, shows excellent electron injecting and hole locking effects, and correspondingly excellent efficiency, luminance, lifetime characteristics, or the like.

BRIEF DESCRIPTION OF THE DRAWINGS

FIG. 1 illustrates a structure of the organic light emitting device of the present invention (Example 2).

FIG. 2 illustrates the energy levels among the light emitting layer, the electron transporting layer, the inorganic insulating layer and the cathode of the device (Example 2) according to the present invention, in comparison with the light emitting layer, the electron transporting layer, the LiF layer and the cathode of the conventional device (Comparative Example 2).

FIG. 3 is a graph illustrating the forward current characteristics (electron injecting characteristics) of the devices prepared in Example 1 and Comparative Example 1.

FIG. 4 is a graph illustrating the reverse current characteristics (hole blocking characteristics) of the devices prepared in Example 1 and Comparative Example 1.

FIG. 5 is a graph illustrating the luminance characteristics of the devices prepared in Example 2 and Comparative Example 2.

FIG. 6 is a graph illustrating the life-time characteristics of the devices prepared in Example 2 and Comparative Example 2.

FIG. 7 is a graph illustrating the forward current characteristics (electron injecting characteristics) of the devices prepared in Comparative Example 3.

BEST MODE FOR CARRYING OUT THE INVENTION

Hereinafter, the present invention will be described in detail.

The organic light emitting device according to the present invention is characterized in that an inorganic insulating layer formed from the materials having a band gap of 3.3 eV or more, and a band offset of 0.45 eV or less, is provided between the electron injecting electrode and the organic material layer.

As used in the present invention, the band gap refers to the difference in energy between the conduction band and the valance band of the inorganic insulating layer. Further, the band offset refers to a measure regarding the energy barrier height between the inorganic insulating layer and the silicone, when the conduction band of the silicone and the conduction band of the inorganic insulating layer are aligned by laminating the inorganic insulating layer on the silicone. The band offset value of the inorganic insulating layer, as measured based on the silicone, is a value inherent in the material, and is proportional to the band offset value of the inorganic insulating layer, as measured based on the electron injecting electrode materials such as Al, rather than silicone. The band offset can be measured using XPS (x-ray Photoelectron Spectroscopy), UPS (Ultraviolet Photoelectron Spectroscopy), or the like.

The inorganic insulating layer formed from the materials having a band gap of 3.3 eV or more, and a band offset of 0.45 eV or less has high efficiency in injecting electrons from the electron injecting electrode to the organic material layer, and excellent ability of blocking the hole movement from the organic material layer to the electron injecting electrode. More specifically, the principle is as follows.

Generally, in an organic light emitting device having a structure wherein a hole injecting electrode, an organic material layer and an electron injecting electrode are sequentially laminated on a substrate, a LiF layer having a thickness of 1.5 to 2 nm as an electron injecting layer was interposed between the electron transporting layer (ETL) and the electron injecting electrode (cathode), Li exists in the form of Li+ ions in the LiF layer, which would cause reaction capable of supplying electrons, thus increasing the electron injecting ability. Based on this principle, the LiF layer used as the electron injecting layer would have no hole blocking ability.

On the other hand, the band alignment characteristics account for the electron injecting ability and the hole blocking ability of the inorganic insulating layer according to the present invention. The present inventors have found that the characteristics, that is, the band offset value, of the electron injecting layer material in conjugation with other materials, not the electron injecting layer material alone, significantly affect the electron injecting ability and the hole blocking ability, and on the basis of this finding, have also found the optimum range of the band offset. In the present invention, in conjugation of an electron injecting electrode usually comprising aluminum (work function: 4.1 eV), etc. and an inorganic insulating layer, the band offset range of the inorganic insulating layer materials was determined in order to select the inorganic insulating layer materials having a proper conduction band, so that the electron injecting barrier height from the electrode to the inorganic insulating layer might be less than the electron injecting barrier height from an electrode to an organic material layer (LUMO: 2.8 eV) such as an electron transporting layer. Specifically, the present inventors discovered $Ta_2O_5$ and $Pb(Ti_{0.55}Zr_{0.45})O_3$ as the inorganic insulating layer materials having a band offset value satisfying the above-described conditions. These materials have band offset values of 0.3 eV and 0.45 eV, respectively. If an electron injecting layer is formed using the materials having a band offset value less than or equal to 0.45 eV, an electron injecting ability compatible with $Ta_2O_5$ and $Pb(Ti_{0.55}Zr_{0.45})O_3$ or great can be attained. Accordingly, in the present invention, the proper band offset range of the inorganic insulating layer materials is no more than 0.45 eV.

Further, the band gap range of the inorganic insulating layer materials was determined taking consideration of the above-determined band offset range, in order to have an energy level no higher than HOMO of BCP (2,9-dimethyl-4,7-diphenyl-1,10-phenanthroline) conventionally used for the hole blocking material, that is, no lower than HOMO of BCP.

Based on this, the organic light emitting device of the present invention is characterized in that an inorganic insulating layer formed from the materials having a band gap of 3.3 eV or more, and a band offset of 0.45 eV or less, is provided between the electron injecting electrode and the organic material layer. The inorganic insulating layer materials preferably have a band gap of 3.3 eV or more and 9 eV or less, and a band offset of 0.3 eV or less.

Based on the above-described principle, in the present invention, by using an inorganic insulating layer formed from the materials having a band gap of 3.3 eV or more, and a band offset of 0.45 eV or less, instead of the LiF layer, an energy barrier can be lowered, which will further increase the electron injecting ability, as compared with the case where electrons are directly injected from an electron injecting electrode to an organic material layer including an electron transporting layer. The inorganic insulating layer according to the present invention has more excellent hole blocking ability than that of BCP which is generally a conventionally used hole blocking material. Accordingly, the organic light emitting device according to the present invention can have excellent electron injecting ability and hole blocking ability by incorporating an inorganic insulating layer satisfying the above-described condition between the electron injecting electrode and the organic material layer, even without incorporation of an additional hole blocking layer.

Specifically, the electron injecting electrode materials include Al, Mo, Ca/Ag, Mg/Ag, Ag, Yb, and transition metal nitrides such as TiN, TaN, ZrN and HfN. Further, as the electron transporting layer material, a compound containing an electron withdrawer capable of stabilizing the anion radical generated when electron injected from the cathode, and an organometallic compound having good electron mobility are usually used. Examples of the compound containing an electron withdrawer include a compound containing a functional group withdrawing electrons by resonance, such as a cyan group, oxadiazole, and triazole. Specific examples of the electron transporting layer material include Alq3, PBD (2-biphenyl-4-yl-5-(4-t-butylphenyl)-1,3,4-oxadiazole), spiro-PBD, oligothiophene such as an aromatic compound containing an imidazole ring, and perfluorinated oligo-p-phenylene. If a $Ta_2O_5$ layer is provided between the electron injecting electrode and the electron transporting layer, each made from the above-described materials, the electron injecting barrier height from the electron injecting electrode to the inorganic insulating layer is about 0.9 eV, and the energy barrier height from inorganic insulating layer to the electron transporting layer is about 0.4 eV. Thus, to provide a $Ta_2O_5$ layer is more favorable than to overcome the electron injecting barrier of 1.3 eV from the electron injecting electrode to the electron transporting organic material layer.

In addition, BCP as one of the conventional hole blocking materials has a LUMO of 3.2 eV, a HOMO of 6.7 eV, and a band gap of 3.5 eV, but $Ta_2O_5$ as one example of the inorganic insulating layer materials according to the present invention has a conduction band of 3.2 eV, a valence band of 7.6 eV, and a band gap of 4.4 eV, resulting in that thus the hole barrier height is larger than that of BCP by 0.9 eV. That is, the inorganic insulating layer according to the present invention can have the electron injecting and hole blocking effects.

On the other hand, the inorganic insulating layer according to the present invention is employable for a device having a bottom emission structure, that is, a structure wherein a substrate, a hole injecting electrode, an organic material layer and an electron injecting electrode are sequentially laminated, as well as a device having a top emission structure (an inverted structure), that is, a structure wherein a substrate, an electron injecting electrode, an organic material layer and a hole injecting electrode are sequentially laminated. In particular, it can be used for a device having an inverted structure for yielding a more excellent effect.

To be more specific, if the organic light emitting device having a bottom emission structure and the organic light emitting device having a top emission structure comprise a LiF layer as an electron injecting layer, difference of about 1 order of the current level flowing through the electron injecting electrode, for example, the aluminum electrode is generated. Specifically, there occurs a phenomenon that the pick-up voltage having a top emission structure gets higher than that of the organic light emitting device having a bottom emission structure by ~1 V. The reason for this is that LiF rests on the surface to be deposited to give other affects on the pick-up voltage, that is, the reaction of LiF on the organic material is more active than the reaction of LiF on aluminum. Accordingly, it is more effective to the organic light emitting device having a top emission structure to use an inorganic insulating layer independent on the surface reaction electron injecting layer, rather than to use LiF dependent on the substrate due to the surface reaction.

In the present invention, the inorganic insulating layer materials preferably have a high dielectric constant, particularly a dielectric constant of 20 or more. And it is more preferable for the inorganic insulating layer materials to have a dielectric constant of 20 or more and 75 or less. A dielectric constant of less than 20 can make a problem of the higher drive voltage caused by the decreasing of the luminescence efficiency and current at the (+) voltage of the formed organic light emitting device. Further, it is desirable that the inorganic insulating layer preferably has a thickness of several nm, preferably 1 to 10 nm. If the inorganic insulating layer has a thickness in the above range, extreme increase in the pick-up voltage of the device can be avoided.

In the present invention, as the inorganic insulating layer materials, preferably used is comprising at least one selected from the group consisting of $Ta_2O_5$, $SrTiO_3$, $Pb(Ti_{0.55}Zr_{0.45})O_3$, and $SrBi_2Ta_2O_9$, or a composite oxide consisting of at least two selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{0.45})O_3$, and $SrBi_2Ta_2O_9$, or a composite oxide consisting of at least one selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{1.45})O_3$, and $SrBi_2Ta_2O_9$, and at least one selected from $BaTiO_3$ and $TiO_2$, and more preferably used is $Ta_2O_5$.

The inorganic insulating layer can comprise a monolayer formed of one of the above-described materials, or a mixture of two or more thereof, or a multilayer in which layers made from different materials are laminated.

The inorganic insulating layer can be formed using a method such as sputtering, CVD (Chemical Vapor Deposition), ALD (Atomic layer deposition), PECVD (Plasma Enhanced Chemical Vapor Deposition), e-beam vacuum deposition, and ion-beam vacuum deposition, but the scope of the present invention is not limited to these methods.

The organic light emitting device of the present invention can be prepared by usual methods and materials for preparing an organic light emitting device, well-known in the art, except that the above-described inorganic insulating layer according to the present invention is formed between the electron injecting electrode and the organic material layer.

In one embodiment of the present invention, an organic light emitting device can have a structure comprising an electron injecting electrode, a hole injecting electrode and an organic material layer interposed therebetween. The structure of the organic light emitting device according to the present invention is illustrated in FIG. 1.

For example, the organic light emitting device according to the present invention can be prepared by depositing a metal, a metal oxide having conductivity, or an alloy thereof on a substrate using a PVD (Physical Vapor Deposition) process such as sputtering and e-beam evaporation to form a hole injecting electrode; forming an organic material layer comprising a hole injecting layer, a hole transporting layer, a light emitting layer and an electron transporting layer on the hole injecting electrode; forming an inorganic insulating layer according to the above-mentioned method and depositing a material, which can be used as an electron injecting electrode, on the organic material layer. Alternatively, the organic light emitting device can be prepared by sequentially forming an electron injecting electrode material, an inorganic insulating layer, an organic material layer, and a hole injecting electrode on a substrate (see International Patent Application Publication No. 2003/012890).

The organic material layer may have a multilayer structure containing a hole injecting layer, a hole transporting layer, a light emitting layer, an electron transporting layer, and the like, but not limited thereto. Alternatively, it may have a monolayer structure. Further, the organic material layer can be produced to have a fewer number of layers, by using a variety of polymeric materials, by means of a solvent process other than a deposit process, such as spin coating, dip coating, doctor blading, screen printing, ink jet printing, and heat transfer processes.

In the device of the present invention, it is preferable that as the organic material layer adjacent to the inorganic insulating layer, an n-type organic material layer, such as an electron transporting layer, or an n-type light emitting layer is disposed. Further, in the device of the present invention, it is preferable that the electron injecting electrode has a work function no more than that of aluminum (Al), and it is formed from materials having high light reflectance.

Hereinafter, the present invention will be described in more detail by means of Examples. However, the following Examples are presented only for illustrative purpose, and it is not intended that the scope of this invention is limited to these Examples.

MODE FOR THE INVENTION

Example 1

In order to confirm the electron injecting ability and the hole blocking ability of $Ta_2O_5$, an Al layer was formed on a glass substrate to a thickness of 100 nm, and then a Ta$_2$O$_5$ layer was formed thereon by e-beam evaporation to a thickness of 1.5 nm. Then, a compound represented by the following formula 1 as an electron transporting material was vacuum-deposited on the Ta$_2$O$_5$ layer to form an electron transporting layer having a thickness of 20 nm.

[Formula 1]

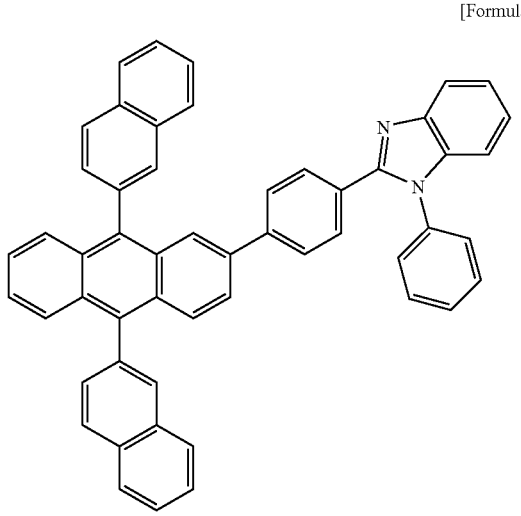

A LiF layer was formed thereon to a thickness of 1.5 nm, and an Al layer was formed thereon to a thickness of 100 nm. The electron injecting ability (forward current characteristics) of the prepared device was measured, and the results are shown in FIG. 3. Further, the hole blocking ability (reverse current characteristics) of the device was measured, and the results are shown in FIG. 4.

Comparative Example 1

A device was prepared in the same manner as in Example 1, except that a LiF layer was formed instead of the Ta$_2$O$_5$ layer. The electron injecting ability and the hole blocking ability of the device was measured, and the results are shown in FIGS. 3 and 4.

Upon comparison of the current capacities at the same voltage in the results of the forward current characteristics and reverse current characteristics measured on the devices of Example 1 and Comparative Example 1, it was found that the device prepared using the Ta$_2$O$_5$ layer (Example 1) has a forward current capacity higher than the device prepared using the LiF layer (Comparative Example 1) by about 1 order, as shown in FIG. 3. It was also found that the device prepared using the Ta$_2$O$_5$ layer (Example 1) has a reverse current value lower than the device prepared using the LiF layer (Comparative Example 1) by about 1 order, as shown in FIG. 4. That is, the device prepared using the Ta$_2$O$_5$ layer of Example 1 has higher forward current characteristics, and lower reverse current characteristics, as compared with the device prepared using the LiF layer of Comparative Example 1. These results indicate that the device of Example 1 is more excellent in the electron injecting and the hole blocking ability than the device of Comparative Example 1.

Example 2

An Al layer was formed on a glass substrate to a thickness of 100 nm, and then a Ta$_2$O$_5$ layer was laminated thereon by e-beam evaporation to a thickness of 20 nm. Then, as the organic material layers, an electron transporting layer (ETL), a light emitting layer (EML), a hole transporting layer (HTL) and a hole injecting layer were formed by vacuum deposition of the electron transporting material represented by the above formula 1, Alq3, NPB, and a hole injecting material represented by the following formula 2 (hexanitrile hexaazatriphenylene, HAT), respectively.

[Formula 2]

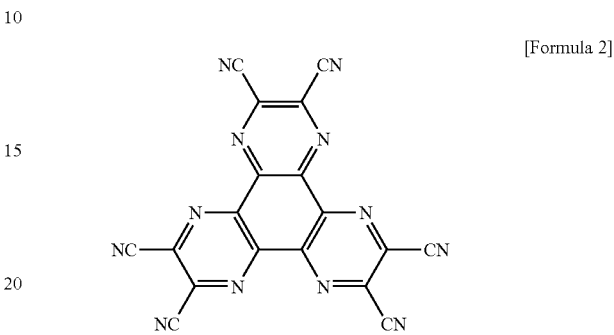

The organic material layers have thicknesses of 20 nm, 30 nm, 40 nm and 50 nm, respectively. Then, an IZO electrode was formed on the organic material layer as a hole injecting electrode by sputtering to a thickness of 150 nm. The structure of the prepared device is shown in FIG. 1.

The energy levels of the light emitting layer, the electron transporting layer, the inorganic insulating layer and the electron injecting electrode of the prepared device are shown in the right side of FIG. 2. The luminance and the life-time of the device were measured, and the results are shown in FIGS. 5 and 6, respectively. Here, the energy level was measured by UPS, the luminance by PR650 colorimeter/radiometer supplied by Photo-Research Inc., and the life-time by a life-time measurement instrument for measuring a luminance, a voltage, etc. at a constant current.

Comparative Example 2

A device was prepared in the same manner as in Example 2, except that a LiF layer was formed instead of the Ta$_2$O$_5$ layer. The energy levels of the light emitting layer, the electron transporting layer, the inorganic insulating layer and the electron injecting electrode of the prepared device are shown in the left side of FIG. 2. Further, the luminance and the life-time of the device were measured, and the results are shown in FIGS. 5 and 6.

As a result of measurement of the luminance, the device of Example 2 showed higher luminance at the same current than that of the device of Comparative Example 2, as shown in FIG. 5. As a result of measurement of the life-time, the device of Example 2 showed more excellent effect than that of the device of Comparative Example 2, as shown in FIG. 6. From the results, it can be found that the device of Example 1 is more well-balanced in electrons and holes, as compared with the device of the device of Comparative Example 1. Specifically, the results obtained from the device of Example 2 indicate that hole injection was more lowered so that the low luminescence efficiency from the excessive hole injection was improved, as compared with that of a general organic light emitting device having extremely significant hole injection. The reason for this is that the device of Example 2 has a band structure as shown in the left side of FIG. 2, and the same effect can also be obtained in a device in which the electron injecting layer comprises an inorganic insulating layer having a band structure or band offset similar to that of $Ta_2O_5$.

Comparative Example 3

A device was prepared in the same manner as in Example 1, except that an $Al_2O_3$ layer (band gap 8.8 eV, band offset 2.8 eV, dielectric constant 9) was formed instead of the $Ta_2O_5$ layer. The results of the forward current characteristics (the electron injecting ability) of the device was measured, and the results are shown in FIG. 7.

Upon comparison of the current capacities at the same voltage in the results of the forward current characteristics measured on the devices of Example 1 and Comparative Example 3, it was found that the device prepared using the $Ta_2O_5$ layer (Example 1) has a forward current capacity higher than the device prepared using the $Al_2O_3$ layer (Comparative Example 3) by about 1 order, as shown in FIG. 7. That is, that the device prepared using the $Ta_2O_5$ layer of Example 1 has higher forward current characteristics, as compared with the device prepared using the $Al_2O_3$ layer of Comparative Example 3. These results indicate that the device of Example 1 is more excellent in the electron injecting ability than the device of Comparative Example 3.

The invention claimed is:

1. An organic light emitting device, wherein an electron injecting electrode, at least one organic material layer including a light emitting layer, and a hole injecting electrode are laminated; and an inorganic insulating layer is provided between the electron injecting electrode and the organic material layer; and
    the inorganic insulating layer is a monolayer or multilayer having two or more layers, comprising at least one selected from the group consisting of, $SrTiO_3$, $Pb(Ti_{0.55}Zr_{0.45})O_3$, and $SrBi_2Ta_2O_9$, or a composite oxide consisting of at least two selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{0.45})O_3$, and $SrBi_2Ta_2O_9$, or a composite oxide consisting of at least one selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{0.45})O_3$, and $SrBi_2Ta_2O_9$, and at least one selected from $BaTiO_3$ and $TiO_2$.

2. The organic light emitting device according to claim 1, wherein the inorganic insulating layer material has a dielectric constant of 20 or more.

3. The organic light emitting device according to claim 1, wherein the inorganic insulating layer has a thickness of 1 to 10 nm.

4. The organic light emitting device according to claim 1, wherein the organic material layer adjacent to the inorganic insulating layer is an n-type organic material layer.

5. The organic light emitting device according to claim 4, wherein the organic material layer adjacent to the inorganic insulating layer is an electron transporting layer.

6. An organic light emitting device, wherein an electron injecting electrode, at least one organic material layer including a light emitting layer, and a hole injecting electrode are laminated; and an inorganic insulating layer consisting of a material having a band gap of 3.3 eV or more, and a band offset of less than 0.3 eV, is provided between the electron injecting electrode and the organic material layer.

7. The organic light emitting device according to claim 6, wherein the inorganic insulating layer material has a dielectric constant of 20 or more.

8. The organic light emitting device according to claim 6, wherein the inorganic insulating layer has a thickness of 1 to 10 nm.

9. The organic light emitting device according to claim 6, wherein the organic material layer adjacent to the inorganic insulating layer is an n-type organic material layer.

10. The organic light emitting device according to claim 9, wherein the organic material layer adjacent to the inorganic insulating layer is an electron transporting layer.

11. A method for preparing an organic light emitting device, comprising a step of forming an electron injecting electrode, at least one organic material layer including a light emitting layer, and a hole injecting electrode, wherein a step of forming an inorganic insulating layer using at least one selected from the group consisting of $SrTiO_3$, $Pb(Ti_{0.55}Zr_{0.45})O_3$, and $SrBi_2Ta_2O_9$, or a composite oxide consisting of at least two selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{0.45})O_3$, and $SrBi_2Ta_2O_9$, or a composite oxide consisting of at least one selected from the group consisting of $Ta_2O_5$, $BaZrO_3$, $ZrO_2$, $HfO_2$, $Y_2O_3$, $La_2O_3$, $ZrSiO_4$, $SrTiO_3$, $Pb(Ti_{0.55}Zr_{0.45})O_3$, and $SrBi_2Ta_2O_9$, and at least one selected from $BaTiO_3$ and $TiO_2$, is performed between the step of forming the electron injecting electrode and the step of forming the organic material layer.

\* \* \* \* \*